United States Patent
Wu et al.

(10) Patent No.: US 10,157,662 B1
(45) Date of Patent: Dec. 18, 2018

(54) STATIC RANDOM ACCESS MEMORY CELL, LAYOUT PATTERN AND OPERATION METHOD THEREOF

(71) Applicant: UNITED MICROELECTRONICS CORP., Hsin-Chu (TW)

(72) Inventors: Ming-Siou Wu, Kaohsiung (TW); Tsung-Hsun Wu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 17 days.

(21) Appl. No.: 15/694,841

(22) Filed: Sep. 3, 2017

(30) Foreign Application Priority Data

Aug. 8, 2017 (TW) ............................. 106126737 A

(51) Int. Cl.
| | | |
|---|---|---|
| *G11C 11/00* | (2006.01) | |
| *G11C 11/412* | (2006.01) | |
| *H01L 27/11* | (2006.01) | |
| *G11C 11/419* | (2006.01) | |
| *H01L 29/66* | (2006.01) | |
| *H01L 29/08* | (2006.01) | |
| *H01L 29/78* | (2006.01) | |

(52) U.S. Cl.
CPC .......... *G11C 11/412* (2013.01); *G11C 11/419* (2013.01); *H01L 27/1104* (2013.01); *H01L 29/0847* (2013.01); *H01L 29/66977* (2013.01); *H01L 29/785* (2013.01)

(58) Field of Classification Search
CPC ... G11C 11/412; G11C 11/413; G11C 11/419; H01L 27/11; H01L 27/1104
USPC .............................................. 365/154, 189.15
See application file for complete search history.

(56) References Cited

U.S. PATENT DOCUMENTS

| | | | |
|---|---|---|---|
| 8,369,134 B2 | 2/2013 | Singh | |
| 8,638,591 B2 | 1/2014 | Saripalli | |
| 9,412,439 B1 | 8/2016 | Fan | |
| 2012/0106236 A1* | 5/2012 | Singh | G11C 11/412 |
| | | | 365/154 |
| 2016/0182023 A1* | 6/2016 | Morris | G11C 11/412 |
| | | | 365/156 |

* cited by examiner

*Primary Examiner* — Son Dinh
(74) *Attorney, Agent, or Firm* — Winston Hsu

(57) ABSTRACT

The present invention provides a memory cell. The memory cell includes a static random access memory (SRAM) cell located on a substrate. The SRAM cell includes a first storage node. At least one tunneling field-effect transistor (TFET), the gate of the tunneling field-effect transistor is electrically connected to the first storage node of the SRAM cell. A read bit line (RBL) electrically connected the drain of the TFET. A read terminal which is connected to a read port voltage (Vrp) and electrically connects to a source of the TFET.

20 Claims, 6 Drawing Sheets

STATIC RANDOM ACCESS MEMORY CELL, LAYOUT PATTERN AND OPERATION METHOD THEREOF

BACKGROUND OF THE INVENTION

1. Field of the Invention

The present invention relates to a semiconductor memory device, in particular, to a semiconductor memory device comprising static random access memory (SRAM) and at least one tunneling field-effect transistor (TFET).

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

SUMMARY OF THE INVENTION

The present invention provides a memory cell. The memory cell includes a static random access memory (SRAM) cell located on a substrate. The SRAM cell includes a first storage node. At least one tunneling field-effect transistor (TFET), the gate of the tunneling field-effect transistor is electrically connected to the first storage node of the SRAM cell. A read bit line (RBL) is electrically connected the drain of the TFET. A read terminal is connected to a read port voltage (Vrp) and electrically connects to a source of the TFET.

The present invention further provides a method for operating a memory cell, the method includes the following steps: firstly, an SRAM memory cell is provided, disposed on a substrate, the SRAM memory cell has a first storage node, at least one tunnel field effect transistor (TFET) is provided, a gate of the TFET is electrically connected to the first storage node, a read bit line (RBL) is provided, which is electrically connected to a drain of the TFET, and a read terminal is provided, electrically connected to a read port voltage (Vrp), and a source of the TFET is electrically connected to the read terminal. Afterwards, the Vrp electrically connected to the read terminal to a first high potential voltage is raised, next, the first high potential voltage electrically connected to the read terminal to a first low potential voltage is then dropped down, and to determine whether a signal stored in the first storage node is a second high potential voltage or a second low potential voltage.

The present invention further provides a layout pattern of a memory cell, the layout pattern includes two inverters, including a first inverter and a second inverter cross-coupled for data storage, each inverter including at least one pull-up device (PLs) and at least one pull-down devices (PDs), at least two pass gate devices (PGs) configured with the two cross-coupled inverters respectively, a first n-type doped region, a second n-type doped region and a p-type doped region disposed in the substrate, wherein the p-type doped region is disposed between the first n-type doped region and the second n-type doped region, one inverter of the two inverters comprises a first extending gate structure, at least parts of the first extending gate structure are extended to the position that disposed between the p-type doped region and the first n-type doped region, a second extending gate structure, arranged parallel to the first extending gate structure, and at least disposed between the p-type doped region and the second n-type doped region, and a connecting structure, electrically connected to the first extending gate structure and the second extending gate structure.

The present invention provides a memory cell comprising an SRAM cell and a read circuit, wherein the read circuit comprises at least one tunneling effect transistor instead of the conventional MOSFET known in the art as the reading transistor. Since the tunneling effect transistor has a lower sub-threshold swing than the MOSFET does, the energy consumption of the overall memory cell can be further reduced and the yield and the sensitivity of the memory cell can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
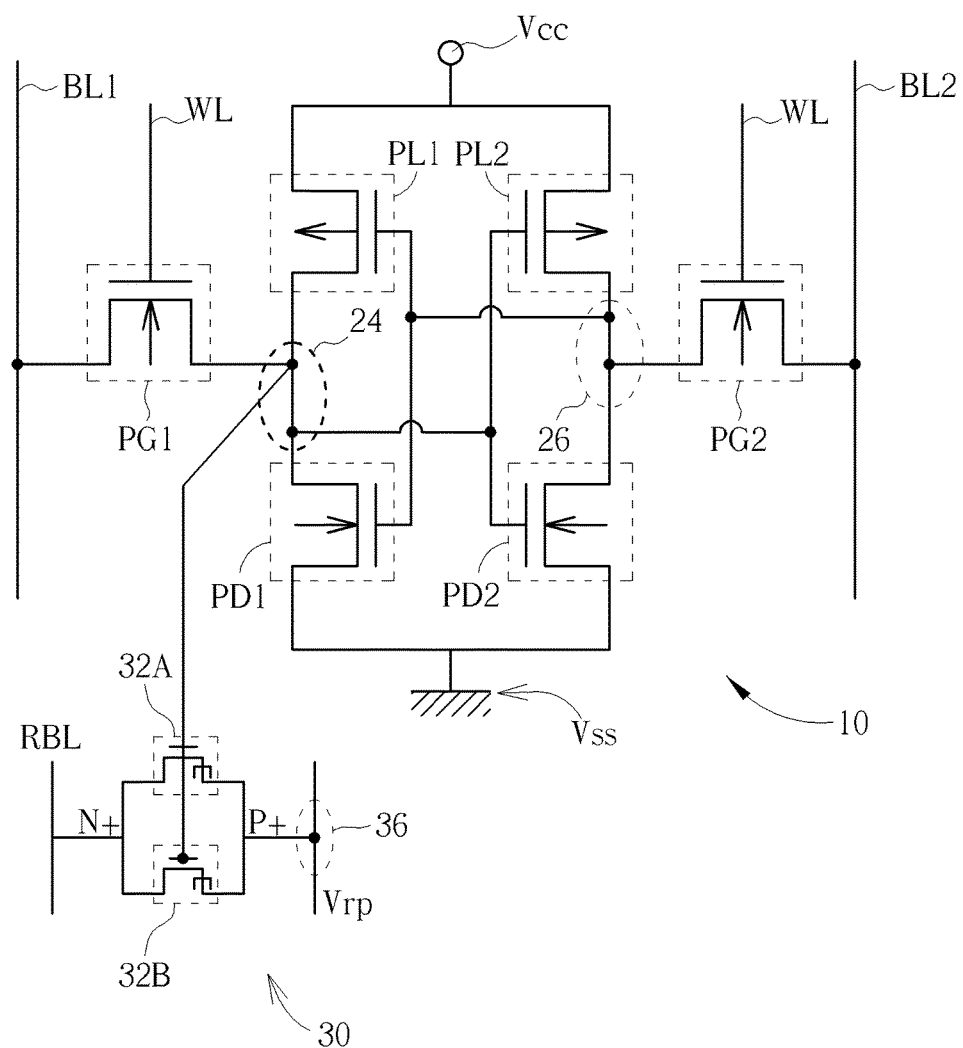
FIG. 1 illustrates a circuit diagram of a six-transistor SRAM (6T-SRAM) cell, which is electrically connected to a read circuit to form a memory cell according to a first preferred embodiment of the present invention.

Please refer to FIG. 1, FIG. 1 illustrates a circuit diagram of a six-transistor SRAM (6T-SRAM) cell which is electrically connected to a read circuit to form a memory cell according to a first preferred embodiment of the present invention. The present invention provides a memory cell, the memory cell includes a static random access memory cell (SRAM) and a read circuit, the static random access memory cell includes a six transistor static random access memory cell (6T-SRAM), but it is noteworthy that, in other embodiments of the present invention, the static random access memory cell is not limited to 6T-SRAM, which may include SRAM cell such as 8T-SRAM, 10T-SRAM, or an SRAM cell with more transistors. The following paragraphs still take the 6T-SRAM as an example.

Please refer to FIG. 1, in this embodiment, each 6T-SRAM cell 10 is comprised of a first pull-up device PL1, a second pull-up device PL2, and a first pull-down device PD1, a second pull-down device PD2, a first pass gate device PG1 and a second pass gate device PG2. These six devices (transistors) constitute a set of flip-flops. The first and the second pull-up devices PL1 and PL2, and the first and the second pull-down devices PD1 and PD2 constitute a latch circuit 22 that stores data in the storage nodes 24 and 26. Since the first and the second pull-up devices PL1 and PL2 act as power load devices, they can be replaced by resistors. Under this circumstance, the static random access memory becomes a four-transistor SRAM (4T-SRAM). In this embodiment, the first and the second pull-up devices PL1 and PL2 preferably share a source/drain region and electrically connect to a voltage source (voltage node) Vcc, and the first and the second pull-down devices PD1 and PD2 share a source/drain region and electrically connect to a voltage source (voltage node) Vss.

Preferably, the first and the second pull-up devices PL1 and PL2 of the 6T-SRAM cell 10 are composed of p-type metal oxide semiconductor (PMOS) transistors; the first and the second pull-down devices PD1 and PD2, the first pass gate devices PG1 and the second pass gate devices PG2 are composed of n-type metal oxide semiconductor (NMOS) transistors, but not limited thereto. The first pull-up device PL1 and the first pull-down device PD1 constitute an inverter, which further form a series circuit 28. One end of the series circuit is connected to a voltage source Vcc and the other end of the series circuit is connected to a voltage source Vss. Similarly, the second pull-up device PL2 and the second pull-down device PD2 constitute another inverter and a series circuit. One end of the series circuit is connected to the voltage source Vcc and the other end of the series circuit is connected to the voltage source Vss. The two inverters are cross-coupled to each other to store data.

The storage node 24 is connected to the respective gates of the second pull-down device PD2 and the second pull-up device PL2. The storage node 24 is also connected to the drain of the first pull-down device PD1, the drain of the first pull-up device PL1 and the source of the first pass gate device PG1. Similarly, the storage node 26 is connected to the respective gates of the first pull-down device PD1 and the first pull-up device PL1. The storage node 26 is also connected to the drain of the second pull-down device PD2, the drain of the second pull-up device PL2 and the source of the second pass gate device PG2. The gates of the first pass gate device PG1 and the second pass gate device PG2 are respectively coupled to a word line (WL); the source of the first pass gate device PG1 and the second pass gate device PG2 are respectively coupled to a first bit line (BL1) and a second bit line (BL2).

In addition, in the present invention, the 6T-SRAM memory cell 10 is electrically connected to a read circuit 30. The read circuit 30 includes at least one tunneling field-effect transistor (TFET) 32A, a read bit line (RBL) connected to a drain of the TFET 32A, one read terminal 36 is connected to a source of the TFET 32A, and the read terminal 36 is connected to a read port voltage (Vrp). In addition, the gate of the TFET 32A is connected to the storage node 24. In other embodiments of the present invention, the gate of the TFET 32A may also be connected to the storage node 26, and the invention is not limited thereto.

Besides, in the present embodiment, another tunneling effect transistor (TFET) 32B may be included and electrically paralleled to the TFET 32A. In other words, the gate of the TFET 32B is connected to the storage node 24, the drain of the TFET 32B is connected to the read bit lines RBL, and the source of the TFET 32B is connected to the read terminal 36. The purpose of adding another TFET in this embodiment is that the current value read in the reading step in the subsequent step can be further increased to improve the accuracy of the element. However, the present invention is not limited to the number of TFETs in parallel with each other. The present invention may contain only one TFET, or a plurality of TFETs in parallel with each other (each TFET has the same type, such as the N-type TFET), all of the embodiments should be within the scope of the present invention.

One features of the TFET is that a TFET only allows the current one-way passing through. In more detail, for example, when the TFET 32B is an N-type TFET, a positive voltage is applied to the gate of the N-type TFET, the electrons can pass through the energy band from the source terminal to the drain terminal, the current will flow from the drain (doped with n+ ions) to the source (doped with p+ ions). However, due to the difference between the energy band, the electron cannot return to the source terminal again from the drain terminal, so the current cannot return from the source terminal to the drain terminal of the N-type TFET. In other words, the current of the TFET of the present invention passes through the element in a single direction. In the case of an N-type TFET, the current can only flow from the drain to the source. The principles of other TFETs are well known in the art and are not described here. In addition, although the N-type TFET is exemplified by the present invention, the P-type TFET is also included in other embodiments, and is also within the scope of the present invention.

Figure 2:
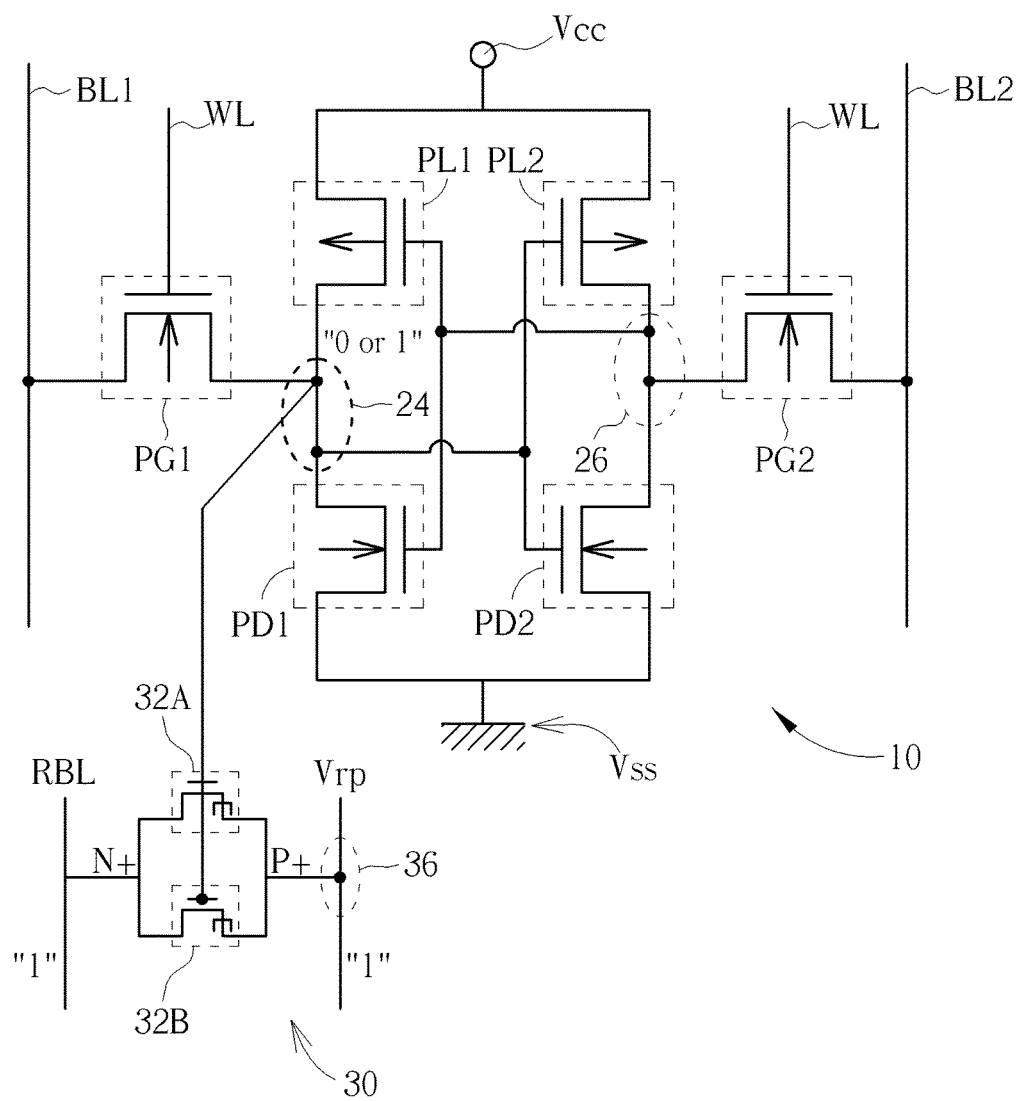
FIG. 2 generally illustrates the memory cell of the present invention in a standby mode.
Figure 3:
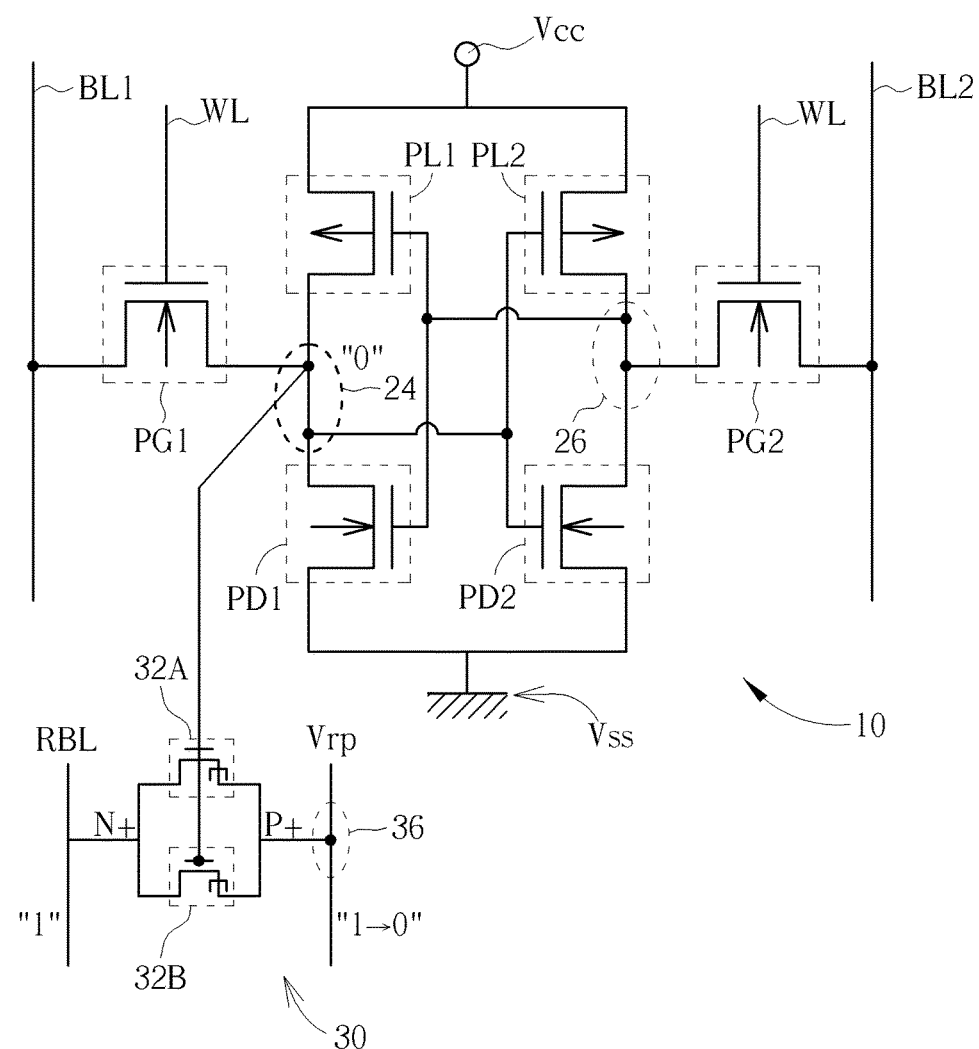
FIG. 3 generally illustrates the memory cell of the present invention in a read mode.
Figure 4:
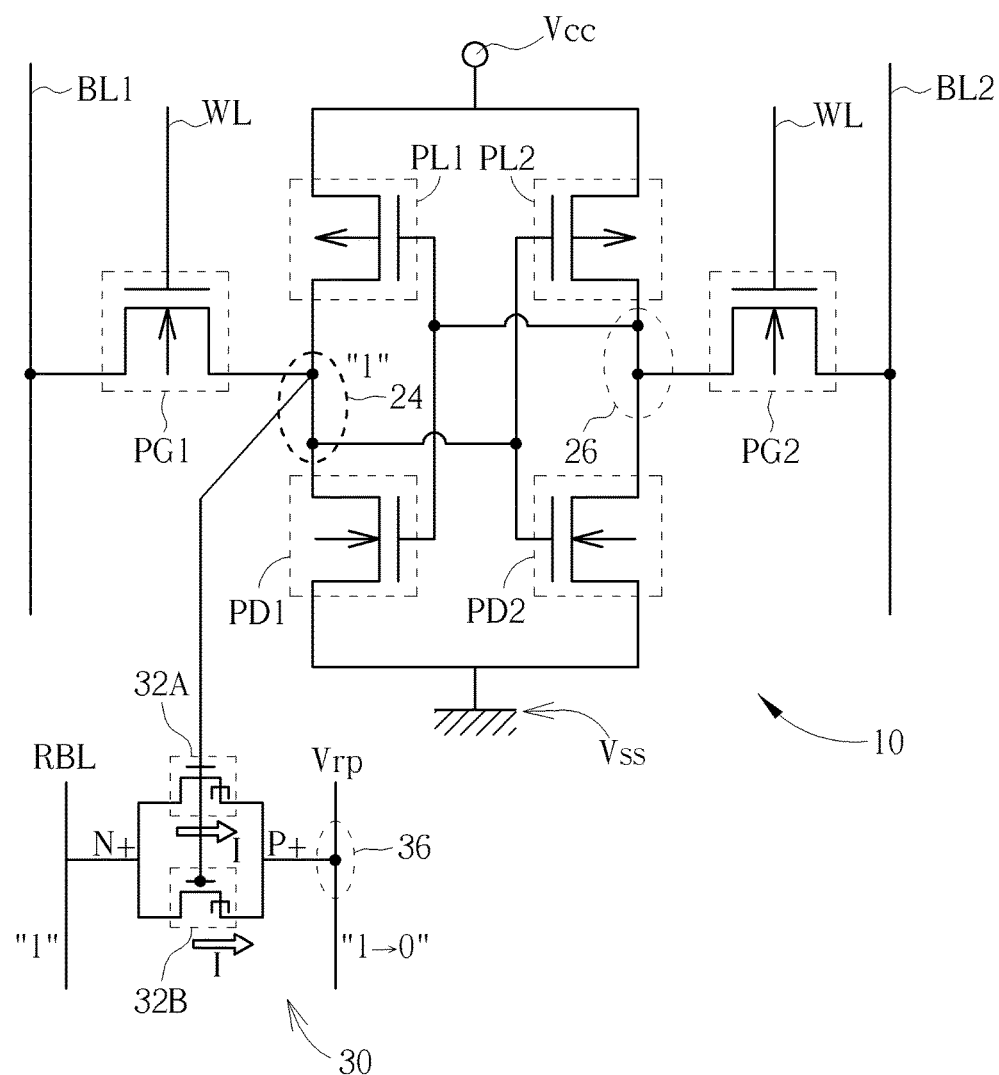
FIG. 4 generally illustrates the memory cell of the present invention in a read mode.

FIG. 2 to FIG. 4 illustrate the operation of the memory cell. As shown in FIG. 2, in a standby mode, the read bit line RBL and the read endpoint 36 are connected to a high potential (e.g., logic "1"). At this time, since the voltage potential at the source/drain of the TFETs (32A and 32B) are both high, the current does not flow from the drain to the source, regardless of whether the data stored in the storage node 24 is logic "0" or logic "1", the signal cannot be detected at read terminal 36.

As shown in FIG. 3, when a read step is performed, the read port voltage (Vrp) electrically connected to the read terminal 36 is dropped from the high potential to the low potential (for example, from logic "1" to "0"). At this time, for each TFET, the voltage potential on the left side (the drain) is higher than the right side (the source). However, if the data stored in the storage node 24 is logic 0, the logic 0 cannot turn on the gate of the TFET 32A and the TFET 32B, so that the current still cannot reach the read terminal 36 through the TFET.

As shown in FIG. 4, the reading step is performed, dropping the read port voltage Vrp which is connected to the read terminal 36 from the high potential to the low potential (for example, from logic "1" to "0"). At this time for each TFET, the voltage potential of the left side (the drain) is higher than the voltage potential of the right side (the source). If the data stored in the storage node 24 is logic 1, the logic 1 (high potential) will turn on the gate of the TFET 32A and the TFET 32B so that the current I will flow from the drain terminal on the left side to the source terminal of the TFET. The current signal can be detected at the read terminal 36. In addition, if more than one TFET are parallel with each other, the detected current signal will be amplified.

As mentioned above, in the memory cell of the present invention, when performing a read step, the read port voltage Vrp which is connected to the read terminal 36 is dropped from the high potential to the low potential. Afterwards, determine whether the read terminal 36 has detected the current signal I or not. In the example mentioned above, if the current signal is detected, the data that stored in the storage node 24 is logic 1. On the other hand, if no current signal is detected, the data that stored in the storage node 24 is logic 0.

Figure 5:
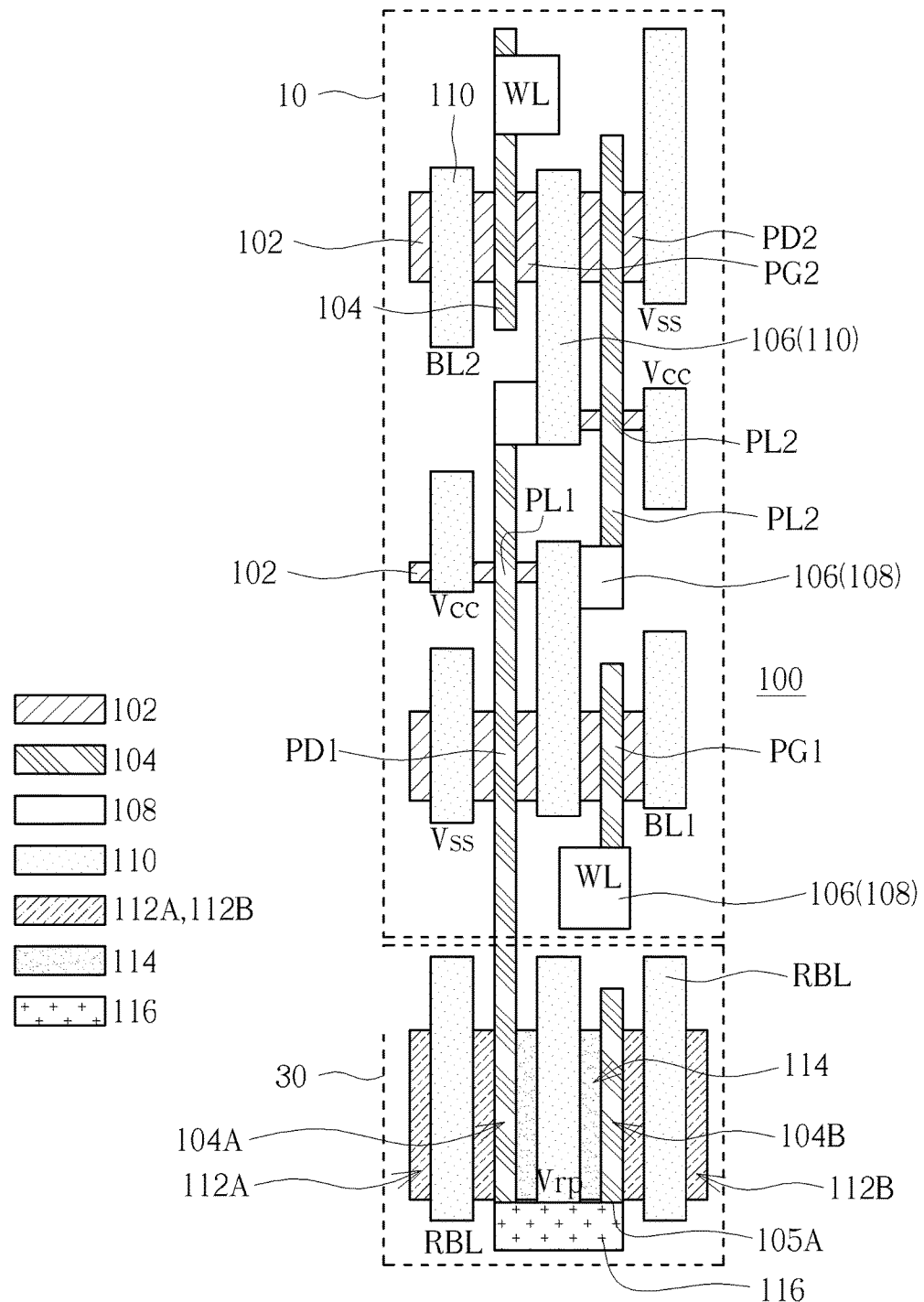
FIG. 5 generally illustrates the layout pattern of the memory cell according to one preferred embodiment of the present invention.

FIG. 5 generally illustrates the layout pattern of the memory cell according to one preferred embodiment of the present invention. As shown in FIG. 5, the memory cell MC of the present invention is disposed on a substrate 100, a plurality of diffusion regions (not shown) and a plurality of fin structures 102 and a plurality of gate structures 104 are formed on the substrate 10. Each fin structure 102 is arranged in a first direction (e.g., the X-axis), and the gate structures 104 are arranged in a second direction (e.g., the Y-axis). The memory cell MC of the present invention is mainly divided into two parts: a 6T-SRAM memory cell 10 disposed in the upper half and a read circuit 30 disposed in the lower half. In the 6T-SRAM memory cell 10, each gate structure 104 crosses over the fin structures 102 to form a plurality of transistors, that is, the first pull-up transistor PL1, the second pull-up transistor PL2, the first pull-down transistor PD1, the second pull-down transistor PD2, the first access transistor PG1, and the second access transistor PG2 shown in FIG. 1. The positions of those transistors are labeled in FIG. 5. Besides, the present invention includes a plurality of contact structures 106, the contact structure 106 further includes gate contact structures 108 (the contact structure that connected to the gate structure 104) and diffusion region contact structures 110 (the contact structure that connected to the diffusion regions). The contact structures 106 connected different components with each other, such as connecting word lines, bit lines and other components to the transistor. The above-described layout pattern for 6T-SRAM is a well-known technique in the art and is not described here. In FIG. 5, in order to simplify the drawing, some elements are not numbered but the elements of the same characteristic (e.g., the same fin structure or the same gate structure) are drawn by the same color (same shading pattern) to clearly indicate the elements. In addition, some voltage sources or elements such as Vrp, Vcc, Vss, WL, BL1, BL2, RBL, etc. are also directly indicated on FIG. 5 to clearly indicate the connection relationship between these elements and the voltage source or elements.

As described above, the present invention is not limited to using 6T-SRAM, and may include other memory cells such as 8T-SRAM and 10T-SRAM. In addition, the layout pattern is not limited to the pattern shown in FIG. 5, and the layout pattern established on the conventional SRAM may be within the scope of the present invention.

The reading circuit 30 of the lower half is included in the layout pattern of the present invention. The reading circuit 30 comprises at least two first diffusion regions 112A, 112B and a second diffusion region 114, the first diffusion regions 112A, 112B include, for example, N-type diffusion regions, and the second diffusion region 114 is, for example, P-type diffusion regions. The second diffusion region 114 is located between the two first diffusion regions 112A and 112B. A gate structure 104A passes between the first diffusion region 112A and the second diffusion region 114, and a gate structure 104B passes between the first diffusion region 112B and the second diffusion region 114.

It is noteworthy that the above-mentioned gate structure 104A extends from the 6T-SRAM memory cell 10 to the read circuit 30 (please also refer to FIG. 1), and the 6T-SRAM memory cell 10 may include two inverters, one of the two inverter includes a longer gate structure 104A. In the layout pattern, the gate structure 104A is longer than the gate structure 104B. In addition, as shown in FIG. 5, a connecting structure 116 is included, which connects the gate structure 104A and a bottom end 105A of the gate structure 104B. The connecting structure 116 is also arranged in the first direction, therefore, as shown in FIG. 5, the gate structure 104A, the connecting structure 116 and the gate structure 104B together form a "J-shaped structure". In addition, the connecting structure 116 preferably does not overlap with the second doped region 114.

Figure 6:
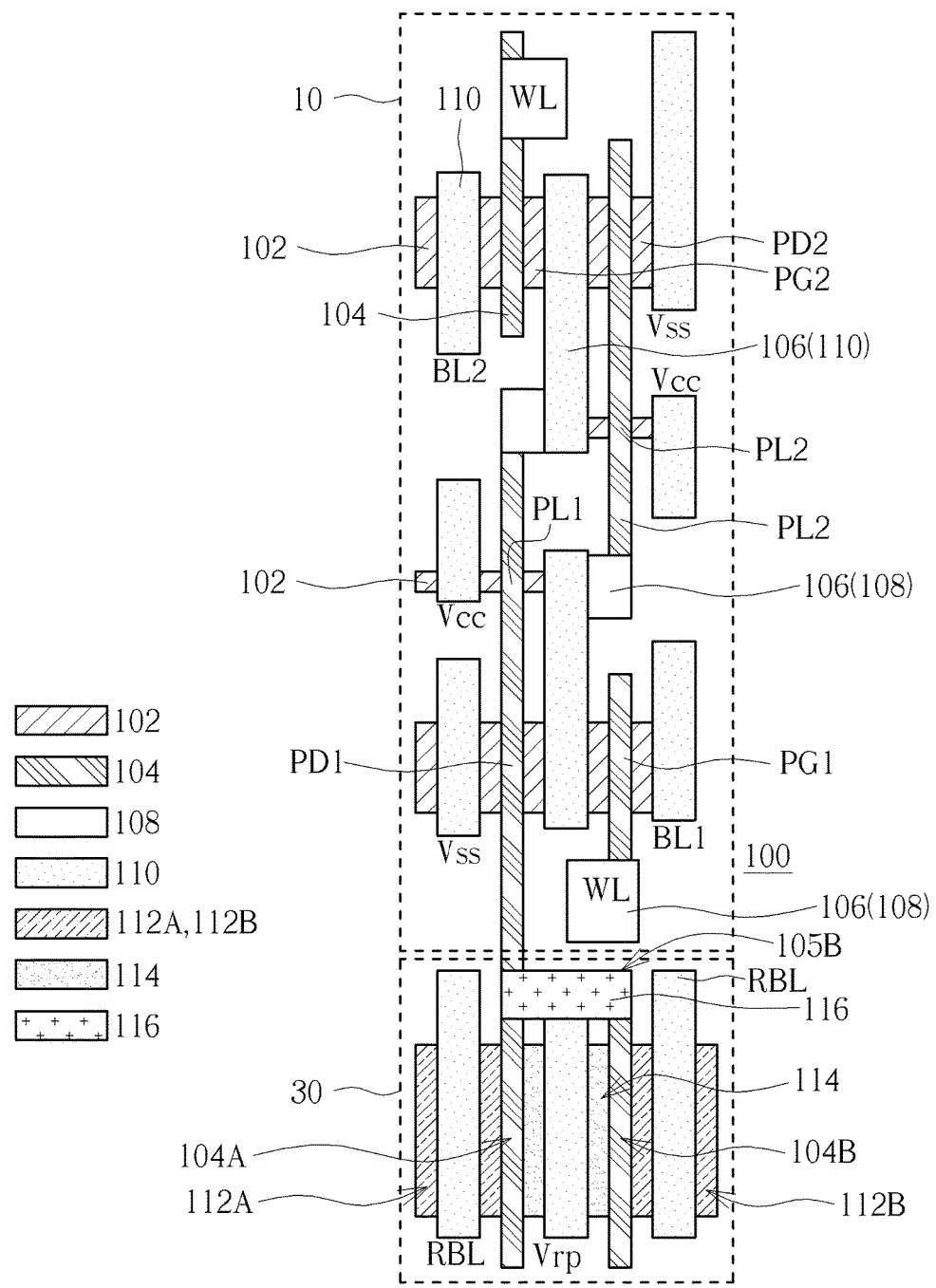
FIG. 6 generally illustrates the layout pattern of the memory cell according to another preferred embodiment of the present invention.

In another embodiment of the present invention, as shown in FIG. 6, the connecting structure 116 connects the gate structure 104A and a top end 105B of the gate structure 104B. Therefore, as shown in FIG. 6, the gate structure 104A, the connecting structure 116 and the gate structure 104B together form an "h-shaped structure". The layout pattern is also within the scope of the present invention.

In summary, the present invention provides a memory cell comprising an SRAM cell and a read circuit, wherein the read circuit comprises at least one tunneling effect transistor instead of the conventional MOSFET known in the art as the reading transistor. Since the tunneling effect transistor has a lower sub-threshold swing than the MOSFET does, the energy consumption of the overall memory cell can be further reduced and the yield and the sensitivity of the memory cell can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory cell, comprising:
a static random access memory (SRAM) cell, disposed on a substrate, the SRAM has a first storage node;
at least one tunnel field effect transistor (TFET), a gate of the TFET is electrically connected to the first storage node;
a read bit line (RBL), which is electrically connected to a drain of the TFET; and
a read terminal, electrically connected to a read port voltage (Vrp), and a source of the TFET is electrically connected to the read terminal.

2. The memory cell of claim 1, further comprising: a first bit line, a second bit line and a plurality of word lines, each memory cell having a first inverter including a first NMOS transistor and a first PMOS transistor; a second inverter including a second NMOS transistor and a second PMOS transistor, the first inverter and the second inverter being coupled to each other; a third NMOS transistor having a source and a drain, coupled to an output terminal of the first inverter and the first bit line respectively; and a fourth NMOS transistor having a source and a drain, coupled to an output terminal of said second inverter and the second bit line respectively, wherein a gate of the third NMOS and a gate of the fourth NMOS are connected to one of the plurality of word lines.

3. The memory cell of claim 2, wherein the first storage node is defined between the source of the third NMOS transistor and the output terminal of said first inverter.

4. The memory cell of claim 1, wherein the TFET comprising an n-type drain region and a p-type source region.

5. The memory cell of claim 4, wherein the p-type source region of the TFET is electrically connected to the read terminal.

6. The memory cell of claim 4, wherein the n-type drain region of the TFET is electrically connected to the RBL.

7. The memory cell of claim 1, wherein the read port voltage is a high potential voltage.

8. The memory cell of claim 1, wherein the TFET allows a current flowing from the drain to the source of the TFET, but does not allow the current flowing from the source to the drain of the TFET.

9. The memory cell of claim 1, further comprising a second tunnel filed effect transistor (TFET), electrically paralleled to the TFET.

10. A method for operating a memory cell, comprising:
providing an SRAM memory cell disposed on a substrate, the SRAM memory cell has a first storage node;
providing at least one tunnel filed effect transistor (TFET), a gate of the TFET is electrically connected to the first storage node;
providing a read bit line (RBL), which is electrically connected to a drain of the TFET; and
providing a read terminal, electrically connected to a read port voltage (Vrp), and a source of the TFET is electrically connected to the read terminal;
rising the Vrp electrically connected to the read terminal to a first high potential voltage;
dropping the first high potential voltage electrically connected to the read terminal to a first low potential voltage; and
determining a signal stored in the first storage node is a second high potential voltage or a second low potential voltage.

11. The method of claim 10, wherein when the first storage node comprises the second high potential voltage, the second high potential voltage turns on a gate of the TFET.

12. The method of claim 11, wherein when the gate of the TFET is turned on, a current flows from the RBL to the read terminal.

13. The method of claim 10, wherein when the first storage node comprises the second low potential voltage, the second low potential voltage turns off a gate of the TFET, and a path from the RBL to the read terminal is an opening circuit.

14. A layout pattern of a memory cell, comprising:
two inverters, comprising a first inverter and a second inverter cross-coupled for data storage, each inverter including at least one pull-up device (PLs) and at least one pull-down devices (PDs);
at least two pass gate devices (PGs) configured with the two cross-coupled inverters respectively;
a first n-type doped region, a second n-type doped region and a p-type doped region disposed in the substrate, wherein the p-type doped region is disposed between the first n-type doped region and the second n-type doped region;
one inverter of the two inverters comprises a first extending gate structure, at least parts of the first extending gate structure are extended to the position that disposed between the p-type doped region and the first n-type doped region;
a second extending gate structure, arranged parallel to the first extending gate structure, and at least disposed between the p-type doped region and the second n-type doped region; and
a connecting structure, electrically connected to the first extending gate structure and the second extending gate structure.

15. The layout pattern of the memory cell of claim 14, wherein an extending direction of the connecting structure is perpendicular to an extending direction of the first extending gate structure and an extending direction of the second extending gate structure.

16. The layout pattern of the memory cell of claim 14, wherein the second extending gate structure comprises a first terminal and a second terminal, the connecting structure is electrically connected to the first extending gate structure and the first terminal of the second extending gate structure.

17. The layout pattern of the memory cell of claim 14, wherein the second extending gate structure comprises a first terminal and a second terminal, the connecting structure is electrically connected to the first extending gate structure and the second terminal of the second extending gate structure.

18. The layout pattern of the memory cell of claim 14, wherein the connecting structure does not overlap with the p-type doped region.

19. The layout pattern of the memory cell of claim 14, further comprising a plurality of fin structures disposed on the substrate, wherein each of the at least one pull-up device (PLs), the at least one pull-down devices (PDs), and the at least two pass gate devices (PGs) includes a fin field-effect transistor (FinFET).

20. The layout pattern of the memory cell of claim 14, wherein a length of the second extending gate structure is shorter than a length of the first extending gate structure.

* * * * *